(12) United States Patent
Fitzpatrick et al.

(10) Patent No.: US 11,681,155 B2
(45) Date of Patent: Jun. 20, 2023

(54) ASYMMETRIC DEFORMABLE DIFFRACTIVE GRATING MODULATOR

(71) Applicant: Teledyne Micralyne Inc., Edmonton (CA)

(72) Inventors: Glen Fitzpatrick, Edmonton (CA); John Harley, Santa Barbara, CA (US)

(73) Assignee: Teledyne Micralyne Inc., Alberta (CA)

(*) Notice: Subject to any disclaimer, the term of this patent is extended or adjusted under 35 U.S.C. 154(b) by 322 days.

(21) Appl. No.: 16/985,110

(22) Filed: Aug. 4, 2020

(65) Prior Publication Data
US 2021/0041713 A1 Feb. 11, 2021

Related U.S. Application Data

(60) Provisional application No. 62/883,984, filed on Aug. 7, 2019.

(51) Int. Cl.
*G02B 27/42* (2006.01)
*G02B 26/08* (2006.01)
*G02B 5/18* (2006.01)

(52) U.S. Cl.
CPC ....... *G02B 27/4233* (2013.01); *G02B 5/1828* (2013.01); *G02B 26/0841* (2013.01); *B81B 2201/047* (2013.01)

(58) Field of Classification Search
CPC .............. G02B 27/4233; G02B 5/1828; G02B 26/0841; G02B 26/0808; G02B 26/0816; G02B 26/0833–0866; B81B 2201/042–047; B81B 2203/0118; G02F 1/292; G02F 1/31
See application file for complete search history.

(56) References Cited

U.S. PATENT DOCUMENTS

| | | | |
|---|---|---|---|
| 6,661,561 B2 | 12/2003 | Fitzpatrick et al. | |
| 6,836,352 B2 | 12/2004 | Fitzpatrick et al. | |
| 6,856,448 B2 | 2/2005 | Fitzpatrick et al. | |
| 8,848,278 B2 | 9/2014 | Pilossof | |
| 2010/0213789 A1* | 8/2010 | Igarashi | B81B 3/0008 438/585 |
| 2014/0192399 A1* | 7/2014 | Pilossof | G02B 26/0841 359/291 |

* cited by examiner

*Primary Examiner* — Kimberly N. Kakalec
(74) *Attorney, Agent, or Firm* — Kirsten M. Oates; Rodman & Rodman LLP

(57) ABSTRACT

A micro-electromechanical structure for modulating light beams includes multiple asymmetric deformable diffractive elements, each having an L-shaped cross section, split pedestal and flexible reflective member. The reflective member has an elongated shape, and a supported part and unsupported part. The split pedestal extends along the long dimension of the supported part of the reflective member and is anchored to a substrate which supports one or more electrodes or serves as an electrode. The diffractive element is movable between a non-energized position wherein the diffractive element acts to reflect a beam of light as a planar mirror, to an energized position wherein upon application of an electrostatic force, the diffractive element flexes independently about an axis parallel to the long dimension of each reflective member to vary a curvature of the reflective member to form a blazed grating.

19 Claims, 6 Drawing Sheets

ASYMMETRIC DEFORMABLE DIFFRACTIVE GRATING MODULATOR

FIELD OF THE INVENTION

The present invention relates generally to micro-electromechanical structures for modulating light beams, and in particular to an improved asymmetric deformable diffractive grating modulator.

BACKGROUND OF THE INVENTION

Micro-electromechanical systems ("MEMS") refer to process technologies used to create integrated devices or systems which combine mechanical and electrical components. They are typically fabricated using integrated circuit processing techniques and can range in size from a few micrometers to millimeters. Spatial light modulators are MEMS-based devices which may be capable of spatially modulating light for use in various applications including, but not limited to, optical processing and switching, image projection, holography, digital printing, laser marking, spectroscopy, etc.

As examples of typical spatial light modulators, light valves are used when a large number of light spots have to be individually modulated. One particular subset of light valves is based on the reflection of the incident light from MEMS deformable mirrors. Typically, MEMS deformable mirrors are composed of a thin silicon membrane with a highly reflective metallic coating, supported by an array of electrostatic micro-actuators.

In general, types of deformable mirror light valves include cantilever or hinged mirror type light valves, membrane light valves, and grating light valves. Cantilever mirror type light valves include a rigid mirror and torsion or flap-based hinges in order to tilt the mirror about its short axis, but exhibit a slow response time of about 10 microseconds due to the low natural frequency of the mirror and large deflection required. Membrane light valves include a flat membrane which is deformed into a concave or spherical mirror to focus light and exhibit a relatively higher response time, but are difficult to fabricate. Grating light valves are free-standing movable reflective ribbons spatially arranged over and anchored to a substrate. By electronically controlling the deflection of the ribbons, grating light valves function as programmable diffraction gratings, thereby enabling attenuation, modulation (including phase angle and steering modulation), and switching of light. Grating light valves exhibit the fastest response time of about 100 nanoseconds, but have low optical efficiency. In one design, the cross section of each diffractive element may be symmetrical in the form of a T-shape, with a movable reflective ribbon mounted on a pedestal and bendable along its long axis (see for example, U.S. Pat. Nos. 6,661,561; 6,836,352; and 6,856,448). However, the diffraction efficiency is very low with a typical contrast of about 5%. In another design, the cross section of each diffractive element may be asymmetrical in the form of an L-shape, with a reflective ribbon having a supported portion mounted on a pedestal and an unsupported elongated portion laterally extending along the pedestal (see for example, U.S. Pat. No. 8,848,278). However, there are fabrication challenges and compromises in making the reflective ribbon architecture fulfill all of the requirements of electrical, mechanical and optical performance.

Accordingly, there is a need in the art for improved asymmetric deformable diffractive grating modulators which mitigate the above shortcomings of prior art light valves.

SUMMARY OF THE INVENTION

The present invention relates generally to micro-electromechanical structures for modulating light beams, and in particular to improved asymmetric deformable diffractive grating modulators.

In one aspect, the invention comprises a microelectromechanical structure for modulating light comprising:

a plurality of asymmetric deformable diffractive elements, each diffractive element having an L-shaped cross section and comprising a split pedestal and a flexible reflective member;

the reflective member having an elongated shape of a long dimension and a short dimension, and comprising a supported part and an unsupported part;

the split pedestal extending along the long dimension of the supported part of the reflective member and being anchored to a substrate parallel to an adjacent split pedestal;

the substrate supporting one or more electrodes or serving as an electrode;

wherein the diffractive element is movable between a non-energized position wherein the diffractive element acts to reflect a beam of light as a planar mirror, to an energized position wherein upon application of an electrostatic force, the diffractive element flexes independently about an axis parallel to the long dimension of each reflective member to vary the curvature of the reflective member to deflect the beam of light.

In one embodiment, the split pedestal comprises two or more portions separated by one or more gaps to yield one or more exposed areas where the reflective member is freely movable without being constrained by the pedestal. In one embodiment, the split pedestal comprises four portions separated by gaps to yield exposed areas. In one embodiment, the reflective member is offset, partially detached, or weakened at one or both pinned ends. In one embodiment, the reflective member comprises a pair of electrode portions separated by a reflective portion electrically isolated and mechanically coupled therebetween. In one embodiment, the reflective member is positioned offset from the split pedestal. In one embodiment, the structure is partially or completely free of an anomaly in the form of a divot or pit.

In one embodiment, the above structure is formed by:

providing the substrate and optionally, a dielectric layer, and fashioning one or more electrodes on the substrate or the dielectric layer;

forming a first insulating layer over the electrode;

forming a sacrificial layer over the first insulating layer and selectively removing the sacrificial layer to yield at least one opening defining at least one original pedestal anchored to the substrate;

forming a second insulating layer to fill the opening and to form the reflective member;

forming a reflective layer over the second insulating layer;

selectively removing the reflective layer and the second insulating layer to form at least one slit extending therethrough to define at least one unsupported part of the reflective member and exposing the sacrificial layer; and selectively removing the sacrificial layer for a predetermined duration to release the unsupported part of the reflective member.

In one embodiment, an anomaly associated with the formation of the original pedestal is removed by depositing a planarization material within the anomaly. In one embodiment, the original pedestal is selectively patterned to form the split pedestal. In one embodiment, the slit is modified to form a bracket-shaped slit or a C-shaped central bracket.

In another aspect, the invention comprises a method for modulating light using a microelectromechanical structure, the micromechanical structure comprising a plurality of asymmetric deformable diffractive elements, each diffractive element having an L-shaped cross section and comprising a split pedestal and a flexible reflective member; the reflective member having an elongated shape of a long dimension and a short dimension, and comprising a supported part and an unsupported part; the split pedestal extending along the long dimension of the supported part of the reflective member and being anchored to a substrate parallel to an adjacent split pedestal; and the substrate supporting one or more electrodes or serving as an electrode;

the method comprising directing a beam of light to the diffractive elements, wherein the diffractive elements act to reflect the beam of light as planar mirrors; and applying an electrostatic force to flex the diffractive elements independently about an axis parallel to the long dimension of each reflective member to vary the curvature of the reflective member to deflect the beam of light.

Additional aspects and advantages of the present invention will be apparent in view of the description, which follows. It should be understood, however, that the detailed description and the specific examples, while indicating preferred embodiments of the invention, are given by way of illustration only, since various changes and modifications within the scope of the invention will become apparent to those skilled in the art from this detailed description.

BRIEF DESCRIPTION OF THE DRAWINGS

The invention will now be described by way of an exemplary embodiment with reference to the accompanying simplified, diagrammatic, not-to-scale drawings. In the drawings.

DETAILED DESCRIPTION OF PREFERRED EMBODIMENTS

Before the present invention is described in further detail, it is to be understood that the invention is not limited to the particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

It must be noted that as used herein and in the appended claims, the singular forms "a," "an," and "the" include plural referents unless the context clearly dictates otherwise.

Figure 1:
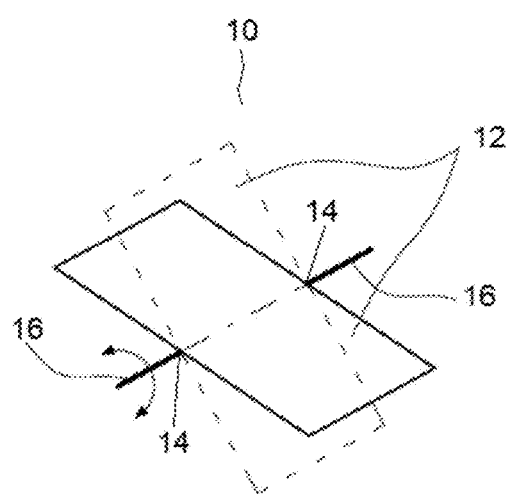
FIG. 1 shows a prior art cantilever mirror device.
Figure 2:
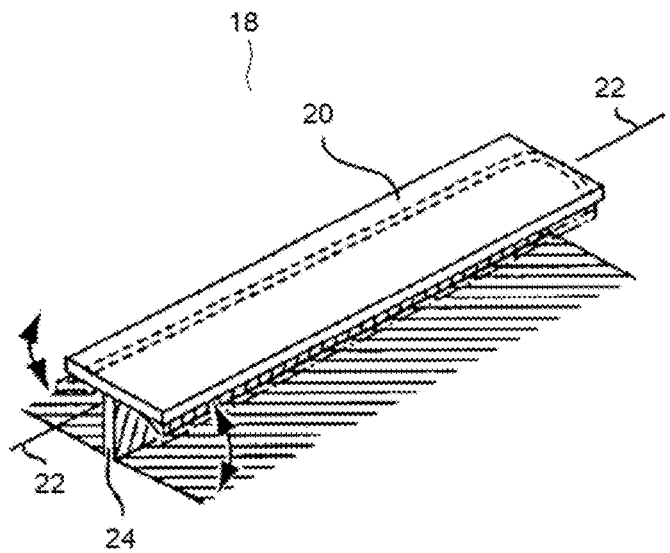
FIG. 2 shows a prior art T-shaped diffractive element comprising an elongated ribbon on a pedestal.

FIGS. 1-3B show different types of prior art deformable mirror light valves. FIG. 1 shows an example of a cantilever mirror type light valve (10) including a rigid mirror (12) and torsion hinges (14) in order to tilt the mirror (12) about its short axis (16). During fabrication, the mirror (12) must be spaced sufficiently high enough above the underlying substrate so that an adequate angle of tilt is provided for the given application. Since large vertical distances are difficult to obtain, tilt angles are generally limited to small values. FIG. 2 shows a prior art T-shaped diffractive element (18) having a symmetrical cross section. A reflective ribbon (20) is mounted along its central long axis (22) on a pedestal (24), and bends along its long axis (22) to move from a non-energized (inactive) T-shape to an in an energized (diffracting) inverted V-shape. During MEMS fabrication, the T-shaped diffractive element (18) is formed as two separate "L-shapes" which are attached together by a hinge mechanism (not shown) to yield the resultant T-shaped diffractive element (18). This construction may make production difficult, and in an energized (diffracting) state, a pixel produces symmetrical angular distribution of light intensity consisting of many diffraction maximums.

Figure 3A:
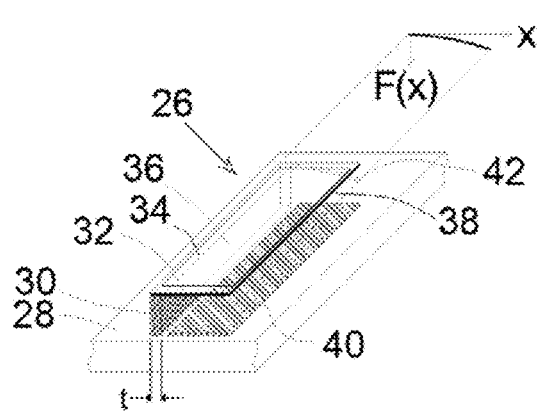
FIG. 3A shows a prior art L-shaped diffractive element comprising an elongated ribbon having a supported portion on a pedestal and an unsupported portion, in a non-energized (inactive) state.
Figure 3B:
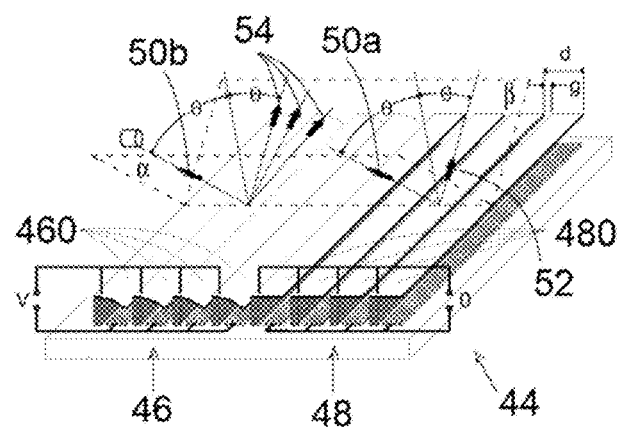
FIG. 3B shows a prior art spatial light modulator comprising a plurality of the L-shaped diffractive elements of FIG. 3A, with the left set in the energized (diffracting) state and the right set in the non-energized (inactive) state.

FIGS. 3A-B show a prior art L-shaped diffractive element (26) having an asymmetrical cross section and fabricated on a silicon substrate (28). The L-shaped diffractive element (26) comprises a pedestal (30) supporting a ribbon (32) having an immovable, supported portion (34) anchored to the pedestal (30), a reflective mirror surface (36), and a movable, unsupported elongated portion (38) laterally extending along the pedestal (30). An electrode (40) is formed on the surface of the silicon substrate (28). Applying voltage between the reflective mirror surface (36) and electrode (40) energizes the ribbon (32) which bends along its shorter axis towards the substrate (28) and assumes position (42) due to electrostatic forces. When the voltage is released, the ribbon (32) snaps back into shape (i.e., flat or in the non-energized (inactive) state). FIG. 3B shows a prior art spatial light modulator (44) comprising a plurality of the L-shaped diffractive elements (26) of FIG. 3A. Each pixel element (46) and (48) consists of four ribbons (diffractive elements 460 and 480), but a pixel can consist of one or more elements, with efficiency increasing with increasing numbers of elements. The pixels are driven using electrodes. Pixel (46) is shown in an energized (diffracting) state while pixel (48) is in a non-energized (inactive) state. Light (50a) falling at the non-energized (inactive) state reflects in one direction (52), while light (50b) falling at the energized (diffracting) state reflects in different directions (54) governed by the laws of diffraction.

As shown in FIG. 3A, the deflection of the ribbon (32) or profile function is represented by F(x). F(x) is considered when calculating the light intensity versus angle in diffracting state and depends on the dimensions of the ribbon (32), the mechanical properties (for example, thickness and strength) of the material forming the ribbon (32), and the applied voltage. Generally, the closer F(x) is to a straight line when deformed, the higher the contrast ratio a spatial light modulator may achieve. As shown in FIG. 3B, the distance "d" between the ribbons (460, 480) is the grating constant and determines the diffracting power of the spatial light modulator (44). The gap "g" is the distance between adjacent ribbons (460, 480). The ratio "d/g" is the fill factor and affects the overall efficiency of the spatial light modulator (44). The higher the fill factor, the higher the efficiency may be of the spatial light modulator (44).

As shown in FIG. 3B, the pedestal (30) acts like a hinge, requiring the immovable, supported portion (34) of the ribbon (32) to be flat, and the movable, unsupported portion (38) of the ribbon (32) to be bendable. The pedestal (30) extends along the length of the ribbon (32) which is thereby anchored along its length and at its ends to facilitate the deflection of the ribbon (32) downward towards the substrate (28) upon voltage application. The high speed of the spatial light modulator (44) may be achieved from the pinning of the ends of the ribbon (32) which keeps the ribbon taut (32) and confers high restoring force, with the anchoring of the ribbon (32) along its length on the pedestal (30) acting as a mechanical support conferring the ability to maintain a flat ribbon (32) in the non-energized (inactive) state. As used herein, the term "restoring force" refers to a force exerted to move the ribbon (74a) from its energized (diffracting) state into its non-energized (inactive) state.

However, the prior art L-shaped diffractive element (26) has major structural disadvantages. Both the pedestal (30) and the flat supported portion (34) of the ribbon (32) may cause undesirable reflections or optical distortions in the non-energized (inactive) state, thereby reducing the optical performance in fill factor, diffraction efficiency, and contrast ratio. Making the pedestal (30) as narrow as possible to minimize undesirable reflections requires substantially decreasing the thickness of the ribbon (32) if formed from the same material as the ribbon (32) when fabricated. However, the issue arises that the ribbon (32) must be sufficiently thick to have speed from the restoring force, but also sufficiently thin to bend downwardly with a minimized flat supported portion. Eliminating the pedestal (30) completely would render the L-shaped diffractive element (26) inoperative as a suspended simple beam.

In addition, during MEMS fabrication of the prior art L-shaped diffractive element (26), formation of the pedestal (30) introduces a significant anomaly in the form of a divot or pit which causes undesirable diffraction in both the non-energized (inactive) and energized (diffracting) states. These challenges are overcome in the MEMS fabrication of the present invention which provides improved L-shaped diffractive elements exhibiting both optical and processing advantages as will be further described.

The present invention relates generally to various embodiments of improved asymmetric deformable diffractive grating modulators or improved L-shaped diffractive elements. In particular, various embodiments of the improved L-shaped diffractive elements do not require an entire pedestal or consequently, an immovable, flat supported portion of the ribbon as present in the prior art L-shaped diffractive element (26). With any portion of the pedestal removed, there is no need for any immovable, flat supported portion of the ribbon in the area of the exposed portion, and the unsupported portion of the ribbon is "unhinged" and can remain relatively flat compared to the curve of the pedestal constrained portions as it bends freely towards the substrate upon electrostatic actuation. The ribbon thus has a pedestal support part which serves as the functional hinge and mechanical influence on the unsupported part which has no pedestal support and is thus unconstrained by the pedestal. The ribbon ideally should exhibit sufficient thickness to have speed from the restoring force, but also sufficient thinness to bend downwardly towards the substrate in a completely hinged system. This configuration may thus decouple the sufficient thinness required for bending downwardly (i.e., F(x) as straight as possible) from the sufficient thickness required for the restoring force. The range of ribbon thickness can be tailored to suit all needs within a larger design space, and can range from hundreds of Angstroms to microns, depending on wavelength of interest and materials being used. Further, this configuration may eliminate undesirable reflections or optical distortion which would arise with the presence of an entire pedestal and the immovable, flat supported portion of the ribbon.

Various embodiments of the improved L-shaped diffractive elements include a ribbon which has been offset, partially detached or weakened at one or both pinned ends in order to reduce the restoring force.

Various embodiments of the improved L-shaped diffractive elements lack an undesirable anomaly in the form of a divot or pit typically associated with formation of the prior art pedestal and which undesirably causes diffraction in the non-energized (inactive) and energized (diffracting) states. Removal of the anomaly may further minimize undesirable reflections or optical distortions arising from the divot, thereby improving optical efficiency.

Various embodiments of the improved L-shaped diffractive elements include the unhinged reflective portion of the ribbon positioned offset from the pedestal (as in FIG. 9A described herein) to achieve a desired contrast ratio. The offset retracts the outermost part of the ribbon from experiencing the touchdown. This can be achieved via layout changes in the mask set to decouple the pedestal influenced F(x) of the driving portion from the desired F(x) of the optical portion.

In general, the various embodiments of the improved L-shaped diffractive elements demonstrate that a compromise between the high speed and straight ribbons when deflected may be achieved with a low stiffness material using a pedestal. Flat actuated ribbons can be achieved, while independently controlling restoring force due to the design of the improved L-shaped diffractive elements described herein.

In one aspect, the invention comprises a microelectromechanical structure for modulating light comprising:

a plurality of asymmetric deformable diffractive elements, each diffractive element having an L-shaped cross section and comprising a split pedestal and a flexible reflective member;

the reflective member having an elongated shape of a long dimension and a short dimension, and comprising a supported part and an unsupported part;

the split pedestal extending along the long dimension of the supported part of the reflective member and being anchored to a substrate parallel to an adjacent split pedestal;

the substrate supporting one or more electrodes or serving as an electrode;

wherein the diffractive element is movable between a non-energized position wherein the diffractive element acts to reflect a beam of light as a planar mirror, to an energized position wherein upon application of an electrostatic force, the diffractive element flexes independently about an axis parallel to the long dimension of each reflective member to vary the curvature of the reflective member and deflect the beam of light.

In general, various embodiments of the improved L-shaped diffractive elements share the same MEMS fabrication steps. In one aspect, the invention comprises a method of producing the above micromechanical structure by:

providing the substrate and optionally, a dielectric layer, and fashioning one or more electrodes on the substrate or the dielectric layer;

forming a first insulating layer over the electrode;

forming a sacrificial layer over the first insulating layer and selectively removing the sacrificial layer to yield at least one opening defining at least one original pedestal anchored to the substrate;

forming a second insulating layer to fill the opening and to form the reflective member;

forming a reflective layer over the second insulating layer;

selectively removing the reflective layer and the second insulating layer to form at least one slit extending therethrough to define at least one unsupported part of the reflective member and exposing the sacrificial layer; and selectively removing the sacrificial layer for a predetermined duration to release the unsupported part of the reflective member.

Figure 4A:
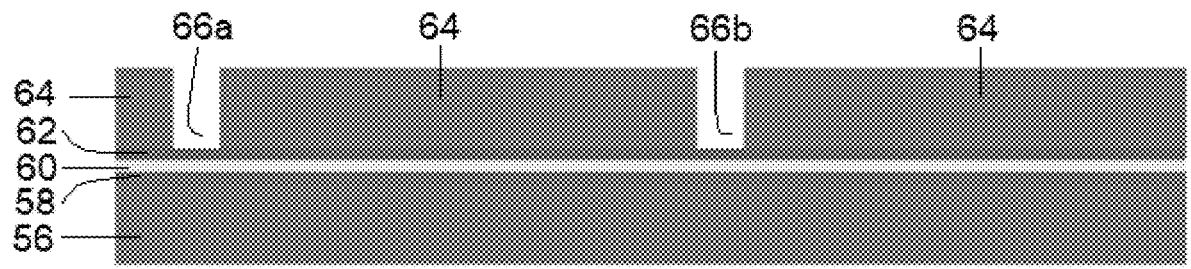
FIGS. 4A-D and F show cross-sectional views of MEMS fabrication of one embodiment of an improved L-shaped diffractive element.

As schematically depicted in FIGS. 4A-D and F, the steps generally include photolithographic masking, deposition, etching, and metallization. As shown in FIG. 4A, the first step is the provision of a suitable substrate (56) upon which subsequent layers will be formed or deposited. Non-limiting examples of substrates upon which the layers are deposited include silicon, glass, fused silica, ceramic, and polymer. In one embodiment, the substrate is silicon. The silicon may be provided in the form of a silicon wafer.

A dielectric layer (58) may be prepared in the form of a film applied to the substrate (56) using any conventional deposition method including, but not limited to, LPCVD; PECVD; physical vapor deposition (PVD) including sputtering, evaporation, and the like; or a combination thereof. The dielectric layer (58) may be used to act as an insulation layer between the substrate (56) and the electrode (60), or the substrate (56) can serve as the electrode itself. Suitable materials for the dielectric layer (58) include, but are not limited to, silicon nitride, crystalline silicon, silicon carbide, or other material.

One or more electrodes (60) may be fashioned on top of the dielectric layer (58) by standard microelectronic processes which will not be detailed herein. Suitable materials for electrodes (60) include, but are not limited to, noble metals including gold, platinum, palladium, or alloys thereof; and other metals including silver, nickel, titanium, tungsten, copper, chromium, or alloys thereof. In one embodiment, the material is selected from titanium, tungsten, gold, or alloys thereof. In one embodiment, the material comprises a titanium-tungsten-gold alloy. In one embodiment, the material may have a thickness of about 200 nm. Alternatively, the substrate (56) could also be used as the electrode itself. In one embodiment, the near-surface region of the substrate may be made conducting (e.g., by doping) in order to serve as a common electrode, negating the need for separate deposition of electrodes (60).

A first insulating layer (62) may be formed or deposited over the electrode (60). In one embodiment, the first insulating layer (62) comprises silicon nitride. In one embodiment, the silicon nitride may have a thickness of about 200 nm to about 700 nm. The first insulating layer (62) may be chemically resistant to etchant to protect the underlying layers (56, 58, 60) from the subsequent sacrificial layer etchant in order to yield the improved L-shaped diffractive element.

A sacrificial layer (64) is formed or deposited over the first insulating layer (62), patterned, and etched to allow the formation of subsequent etch barriers which will exist after the first insulating layer (62) is deposited, and then become the pedestals when the ribbons are released. In one embodiment, the sacrificial layer (64) comprises silicon. In one embodiment, the sacrificial layer (64) comprises amorphous silicon. The selective removal of portions of the sacrificial layer (64) may be performed by techniques known to those skilled in the art including, but not limited to, photolithographic masking and etching (e.g., "wet" chemical etchants, and "dry" reactive-ion etching (RIE) using plasma etching techniques or vapour phase reactions). Sacrificial layer techniques are standard microelectronic processes which will not be detailed herein. As shown in FIG. 4A, one or more selected portions of the sacrificial layer (64) are removed while the first insulating layer (62) is chemically resistant to the etchant to define one or more openings (66a, 66b) having vertical sidewalls within the sacrificial layer (64) and exposing portions of the first insulating layer (62). In one embodiment, each of the one or more openings (66a, 66b) has a width or thickness "t" since each of the openings (66a, 66b) defines the location of a future pedestal.

Figure 4B:
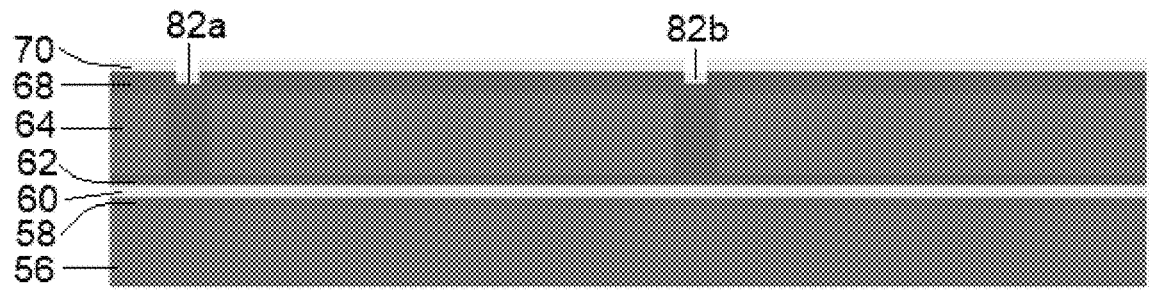

As shown in FIG. 4B, a second insulating or "masking" layer (68) is formed or deposited over the topography shown in FIG. 4A and will form the future pedestals and ribbons, and serve as the mechanical portion providing restoring force. In one embodiment, the second insulating layer (68) may also be bonded onto pedestals made of compatible material. In one embodiment, the second insulating layer (68) may comprise silicon nitride, silicon carbide, or any other suitable dielectric which is sufficiently strong to provide a fast response time, high power handling capability, and long life. The second insulating layer (68) fills the openings (66a, 66b) formed in the topography of FIG. 4A so as to prevent etching, and spreads across the top of the sacrificial layer (64) to form the future ribbons. The thickness of the second insulating layer (68) in various embodiments of the improved L-shaped diffractive element may be increased compared to a corresponding layer in the prior art L-shaped diffractive element (26). In one embodiment, the thickness of the second insulating layer (68) may range between about 50 nm to micron scale. Without being bound by any theory, a ribbon exhibiting thickness within this range may have sufficient thickness to have speed from the restoring force, but also sufficient thinness to bend downwardly towards the substrate (56) to maximize the straightness of F(x) in the deflected state.

A reflective layer (70) composed of a reflective material may then be deposited over the second insulating layer (68) by coating, shadow masking, or other suitable technique. In one embodiment, the reflective layer (70) is deposited on the second insulating layer (68) by shadow masking. Shadow masking is a standard technique which will not be detailed herein, but briefly involves placement of a shadow mask or thin metallic sheet with pattern features etched therein upon the desired topography in order to deposit the thin metallic sheet using a thin film deposition chamber. The reflective layer (70) may also be the electrode layer for simplicity, or the materials may be independent to allow their optimization.

The reflective layer (70) may serve as a reflector of light, a driving electrode, or both. Preferably, the reflective layer (70) is sufficiently thin to minimize surface roughness which may scatter light and reduce the contrast ratio. As used herein, the term "contrast ratio" refers to the ratio of the luminance of the brightest color (white) to that of the darkest color (black) that a system is capable of producing. A high contrast ratio (i.e., "high" meaning 100% or as close to 100% as possible) is a desired aspect of any display. High contrast ratios provide crisper images for optical applications, and are optically efficient with respect to reducing the expense for a laser light and waste light causing thermal and optical interference within the system. In one embodiment, the reflective layer (70) has a thickness of at least 40 nm to the micron scale. In one embodiment, the reflective layer (70) has a thickness ranging between about 40 nm to about 200 nm.

The reflective layer (70) may be selected depending upon the type of light being reflected, and/or for use as a reflector of light, a driving electrode, or both. Suitable materials for the reflective layer (70) may include, but are not limited to, aluminum, gold, silver, copper, chromium, titanium, tungsten, and alloys thereof. In one embodiment, the material is selected from chromium, gold, titanium, or tungsten. In one embodiment, the material comprises a chromium-gold alloy. In one embodiment, the material comprises a titanium-tungsten-gold alloy. As mentioned, the reflective layer (70) may serve as a reflector of light, a driving electrode, or both. The materials for the reflector of light may be different or the same as the materials for the driving electrode. In this manner, reflection enhancement multi-layer stacks or simply thin reflective layers may be used. In one embodiment, a thin layer of aluminum may be used for the reflector and the driving electrode. Additional layers of aluminum may be used for the die attach, and reflection enhancement coatings may be applied either before or after the ribbon release either over the whole device, or through a masking mechanism.

In one embodiment, the reflective layer (70) deposited on the entirety of the ribbon comprises the same material. In one embodiment, the reflective layer (70) deposited on the immovable, supported portion of the ribbon anchored to the pedestal comprises a different material compared to the reflective layer (70) deposited on the movable, unsupported elongated portion of the ribbon laterally extending along the pedestal.

In one embodiment, the pedestals (80a, 80b) and second insulating layer (68) may be formed of the same or different material, depending on whether or not the second insulating layer (68) has been bonded to an initially formed pedestal (80a, 80b). In one embodiment, a bonded process may be used whereby the pedestals (80a, 80b) and gaps (78a, 78b) are initially formed. The second insulating layer (68) is then bonded on top of the pedestals (80a, 80b) and gaps (78a, 78b) to form the ribbons (74a, 74b). In one embodiment, silicon may be used as the second insulating layer (68). This bonded process could be applied practically to long wavelength devices, though not shorter visible wavelengths.

Figure 4C:
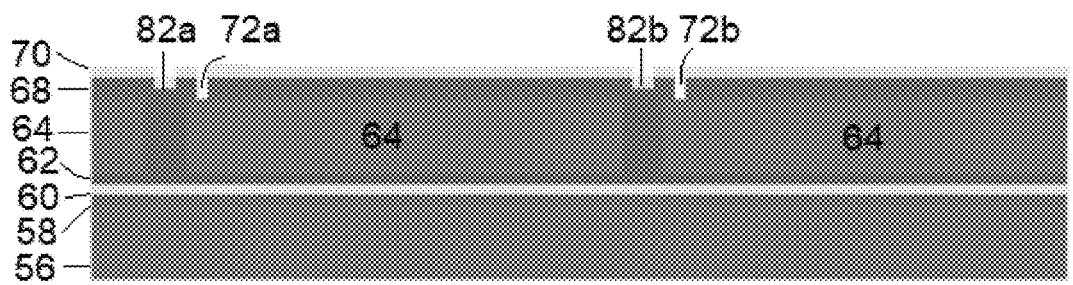
Figure 4D:
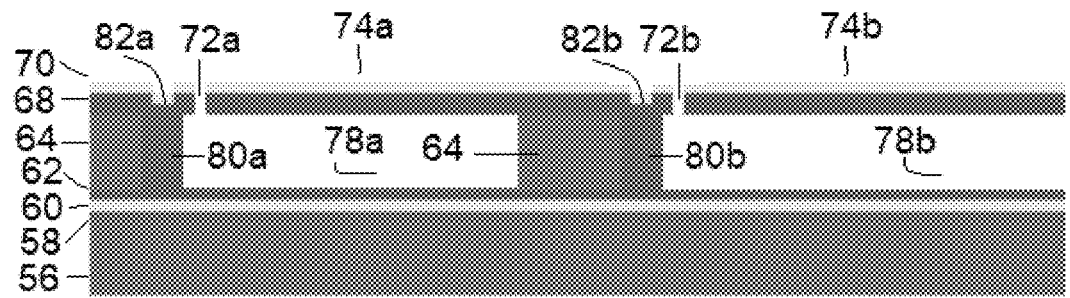

As shown in FIGS. 4C-D, each slit (72a, 72b) defines one end of the ribbon (74a, 74b) which becomes the movable, unsupported elongated portion of the ribbon (74a, 74b), and exposes the sacrificial layer (64). In one embodiment, the slit (72a, 72b) may be the only non-reflective or mirror portion of the L-shaped diffractive element. In one embodiment, the slit (72a, 72b) has a width ranging from about 20 nanometers to about 2 microns in order to maximize the useable mirror area to approximately greater than 95% of the total area. Without being bound by any theory, it may provide a more linear mirror profile on deflection, thus offering better diffraction than prior art devices.

Figure 4E:
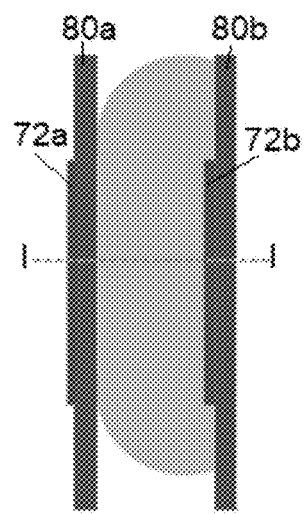
FIG. 4E shows a plan view of the L-shaped diffractive element.
Figure 4F:
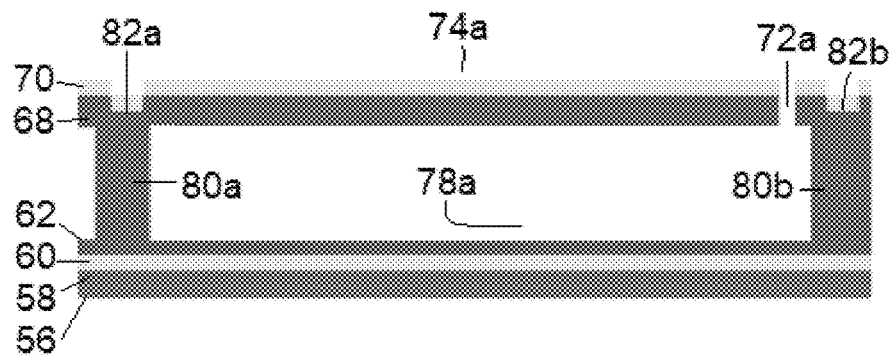
FIG. 4F is a cross-sectional view taken along line I-I of FIG. 4E showing the slits formed within the reflective layer and the second insulating layer.

As shown in FIG. 4D, the sacrificial layer (64) is removed by etching to form an air gap (78a, 78b), thereby allowing release of the ribbon (74a, 74b). Etching may be conducted for a sufficient duration to proceed in one or more directions towards one or more etch barriers which form the future pedestals. FIG. 4E shows a plan view of the L-shaped diffractive element during this step of MEMS fabrication. When immersed in the etchant, the sacrificial layer (64) is undercut isotropically from the ribbon (74a, 74b) in a shape dictated by the lithographic layout of the slit (72a, 72b) to form the movable, unsupported elongated portion of the ribbon (74a, 74b).

In one embodiment, the sacrificial layer (64) is removed by dry etching in order to eliminate stiction problems that occur during conventional wet etching processes, and to ensure compatibility of any materials used as opposed to materials which may be incompatible with the sacrificial layer liquid etchants. In one embodiment, dry etching is conducted using xenon difluoride. In one embodiment, the air gap has a thickness of about 220 nm, as dictated by the thickness of the sacrificial layer (64), but is designed to suit optical considerations. The air gap (78a, 78b) defines the components of the L-shaped diffractive element to include the ribbon (74a, 74b) and a pedestal (80a, 80b). The ribbon (74a, 74b) comprises the immovable, supported portion anchored to the pedestal (80a, 80b) and the movable, unsupported elongated portion laterally extending along the pedestal (80a, 80b) and overhanging the air gap (78a, 78b).

Since the thickness "t" of the pedestal (80a, 80b) and associated diffraction effects from fabrication artifacts can decrease contrast by orders of magnitude, etching of the sacrificial layer (64) is allowed to proceed for a predetermined time in order to yield the pedestal (80a, 80b) having a desired thickness "t." In one embodiment, the pedestal (80a, 80b) has a thickness in the range of 200 nanometers to greater than 2 microns. In one embodiment, the pedestal (80a, 80b) has a thickness of about 1.5 microns. In one embodiment, the pedestal (80a, 80b) has a thickness sufficient to decrease contrast by at least three orders of magnitude when compared for example, to the contrast exhibited by the prior art L-shaped diffractive element of FIG. 3A.

It is contemplated that the dimensions of the ribbon (74a, 74b) may vary. A suitable length may be selected to meet mechanical requirements. In one embodiment, the ribbon (74a, 74b) may be any elongated shape having a long dimension and a short dimension. In one embodiment, the ribbon (74a, 74b) is substantially rectangular-shaped having a greater length than width. In one embodiment, the ribbon (74a, 74b) has a length ranging from about 50 microns to about 2 mm. A suitable width may be selected to provide a pitch conferring a desired diffraction angle. In one embodiment, the ribbon (74a, 74b) has a width ranging from micron scale to greater than 10 microns. A suitable thickness may be selected to dictate the restoring force, voltage, and curvature, thereby determining the deflection of the ribbon or profile function as represented by F(x) which the lithographic and process considerations herein seek to improve. In one embodiment, the ribbon (74a, 74b) has a thickness ranging from about 100 Angstroms to microns. In one embodiment, the ribbon (74a, 74b) has a width of about 10 microns, a length of about 200 microns, and a thickness of about 240 nm.

Figure 5:
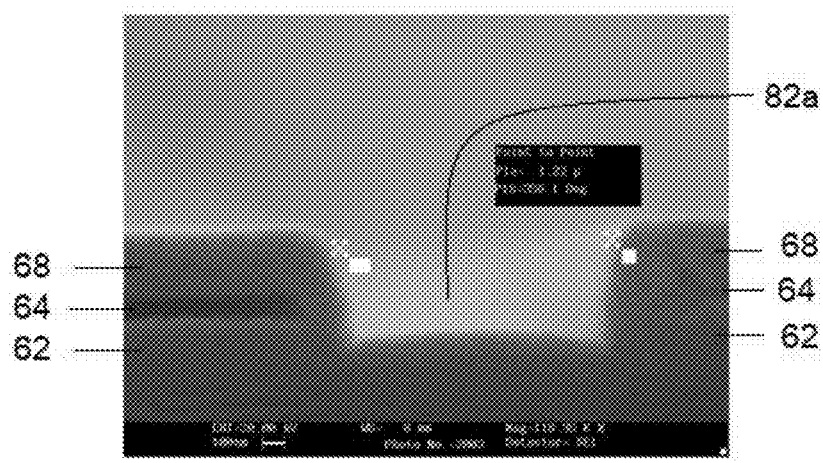
FIG. 5 is a scanning electron microscope (SEM) image of a portion of the L-shaped diffractive element of FIG. 4B including a divot formed during MEMS fabrication.
Figure 6:
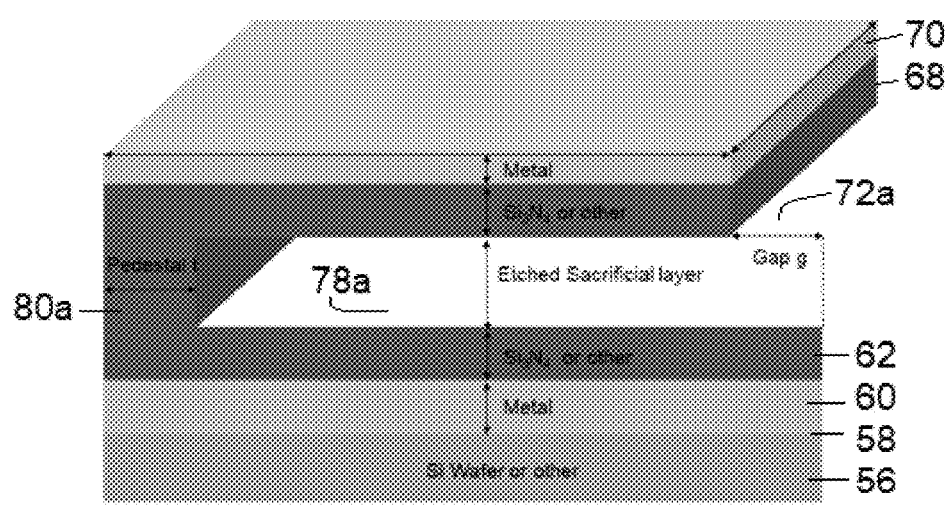
FIG. 6 shows a cross-sectional view of one embodiment of an L-shaped diffractive element formed using the MEMS fabrication according to FIGS. 4A-D and F.

In some instances, MEMS fabrication of the prior art L-shaped diffractive element (FIG. 3A) may yield an anomaly in the form of a divot or pit which may undesirably cause diffraction in the non-energized (inactive) and energized (diffracting) states. Such scattering of light may impact optical efficiency. Typically, the divot has a width ranging from about 50 nm to about 1.5 microns, and may have a length corresponding to the length of the ribbon such as, for example, about 200 microns. During MEMS fabrication of the improved L-shaped diffractive element, additional optional steps may be performed to partially or completely remove the divot (82a, 82b) in the event that the presence of the divot (82a, 82b) may adversely impact the improved L-shaped diffractive element for the intended application (FIGS. 4B-D and F; FIG. 5). In one embodiment, before deposition of the reflecting layer (70) on the topology shown in FIG. 4B, a planarization material may be deposited to fill and subsequently smooth over the divot (82a, 82b) through polishing. In one embodiment, the planarization material may comprise silicon or amorphous silicon. Any suitable amount needed to fill the divot (82a, 82b) sufficiently may be deposited. In one embodiment, about 6000 Angstroms of the planarization material may be deposited. After the divot (82a, 82b) has been filled and smoothed over using one or more suitable standard chemical mechanical polishing techniques, the divot (82a, 82b) is then coated with the reflecting layer (70) which protects the planarization material within the divot (82a, 82b) during etching of the sacrificial layer (64). In one embodiment, the L-shaped diffractive element having the divot removed (82a, 82b) may comprise the structure as shown in FIG. 6. In the development of the invention, it was found that the improvement in contrast from having a pedestal with a divot compared to a pedestal lacking a divot can be orders of magnitude.

In various embodiments of the improved L-shaped diffractive element, portions of the pedestal (80a) may be selectively patterned though layout changes using the above MEMS fabrication steps in order to decouple the mechanical deformation of the L-structure from the optical portions deformation (keeping F(x) a straight line) and optical properties, thereby yielding the desired contrast and efficiency. In the development of the invention, it was found that the difference in contrast between having an entire pedestal compared to a partial or incomplete pedestal lacking portions thereof can be orders of magnitude. Without being bound by any theory, increasing the thickness of the second insulating layer (68) may increase the restoring force (i.e., the force exerted to move the ribbon (74a) from its energized (diffracting) state into its non-energized (inactive) state), thereby requiring an increase in voltage which is to be applied and increasing the speed of the ribbon (74a). The restoring force may be reduced (hence, reduce the voltage required at the expense of ribbon speed) by modifying the pedestal (80a), the ribbon (74a), or both as further described. In contrast, in the prior art device (FIG. 3B), thickness of the second insulating layer dictates deflection shape F(x) and restoring force; however, the optimization of each may be counter to each other. Further, in the prior art device, a pedestal-constrained ribbon may be less diffractive than a ribbon which is unconstrained by the pedestal.

Figure 7A:
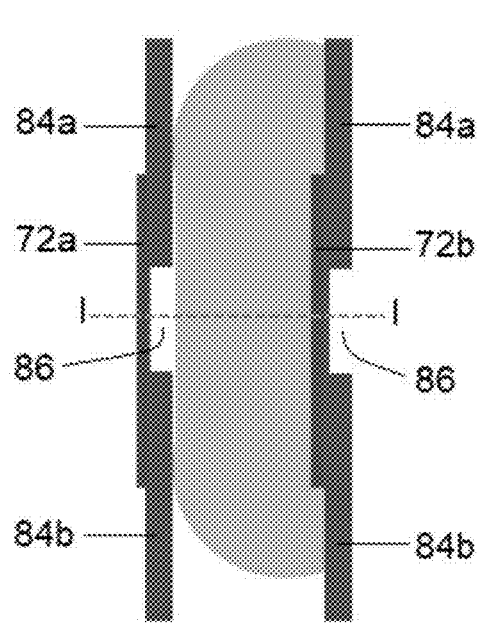
FIG. 7A shows a plan view of one embodiment of an improved L-shaped diffractive element including a modified pedestal split into two portions.

In the present invention, a "split" pedestal allows a portion of the ribbon to be free of constraints from pedestal mechanical influences. In one embodiment, FIG. 7A shows a plan view of one embodiment of an improved L-shaped diffractive element with the reflecting layer (70) removed for clarity. In one embodiment, the L-shaped diffractive element comprises a modified pedestal which has been split into two portions. A portion of the pedestal (80a, 80b) has been removed to define a first pedestal portion (84a) and a second pedestal portion (84b) which are separated by a gap (86) exposing a central portion. FIG. 7B shows the L-shaped diffractive element of FIG. 7A in a non-energized (inactive) state, with the ribbon (74a) relatively flat and without aberration or imposed influence due to the removal of the pedestal (80a). FIG. 7B is a cross-sectional view taken along line I-I of FIG. 7A, showing the L-shaped diffractive element of FIG. 7A in a non-energized (inactive) state where the ribbon (74a) lies flat. FIG. 7C is a cross-sectional view showing the L-shaped diffractive element of FIG. 7B in an energized (diffracting) state, with the ribbon (74a) remaining relatively straight as it bends towards the substrate (56) upon application of voltage, as its movement is not constrained as would be the case if the ribbon were fixed to the pedestal. The energized (diffracting) state may be applied either with or without electrode influence on the area without a pedestal.

Figure 7D:
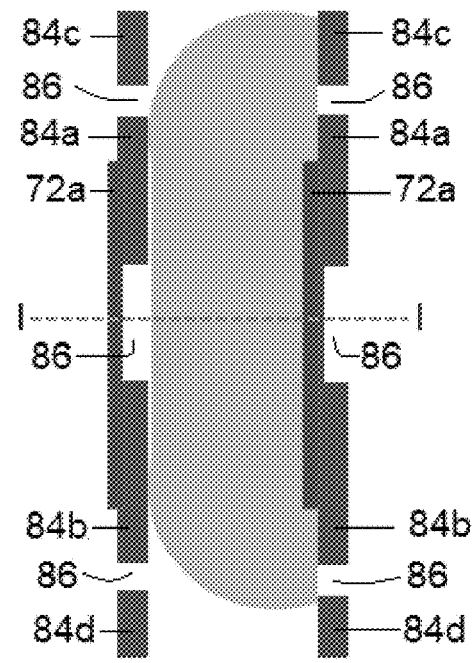
FIG. 7D shows a plan view of one embodiment of an improved L-shaped diffractive element including a modified pedestal split into more than two portions.
Figure 7B:
FIG. 7B is a cross-sectional view taken along line I-I of FIG. 7A or D, showing the L-shaped diffractive element of FIG. 7A or D in a non-energized (inactive) state.
Figure 7C:
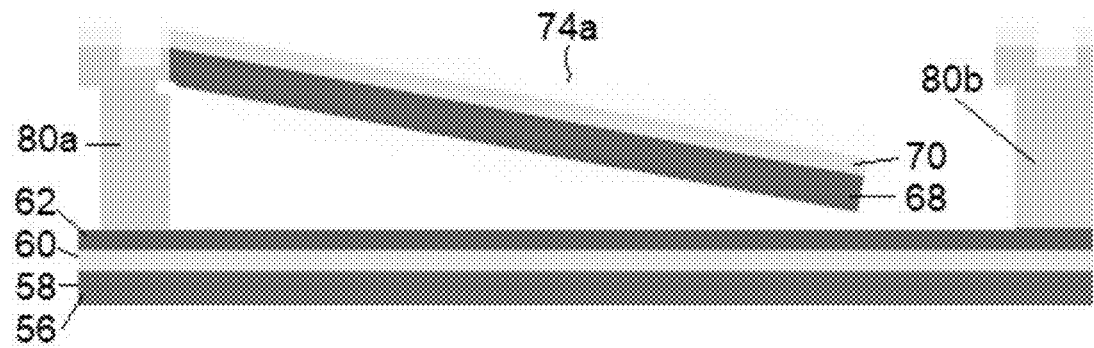
FIG. 7C is a cross-sectional view showing the L-shaped diffractive element of FIG. 7B in an energized (diffracting) state.

In one embodiment, FIG. 7D shows a plan view of one embodiment of an improved L-shaped diffractive element with the reflecting layer (70) removed for clarity. In one embodiment, the L-shaped diffractive element comprises a modified pedestal which has been split into more than two portions. Additional portions within the pedestal (80a, 80b) have been removed to define a first pedestal portion (84a), a second pedestal portion (84b), a third pedestal portion (84c), and a fourth pedestal portion (84d). Due to the plurality of weakening gaps (86) within the pedestal (80a, 80b), the majority of the immovable, supported portion of the ribbon (74a) anchored to the pedestal (80a, 80b) in a conventional L-shaped diffractive element (26) has been removed, allowing the majority of the movable, unsupported elongated portion of the ribbon (74a) to remain relatively straight as it bends towards the substrate (56) upon application of voltage.

Figure 8A:
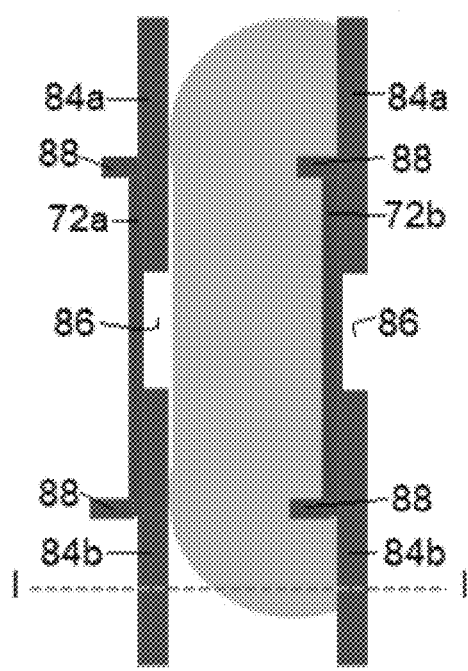
FIG. 8A shows a plan view of one embodiment of an improved L-shaped diffractive element including a modified pedestal split into two portions and modified bracket-shaped slits.

In the present invention, the ribbon may be further freed from the mechanical constraints of the pedestal by modifying the pattern of the slit which defines the L-shaped diffractive element by forming a bracket-shaped slit (FIGS. 8A-B) or a C-shaped central bracket (FIGS. 9A-D). In one embodiment, FIG. 8A shows a plan view of one embodiment of an improved L-shaped diffractive element with the reflecting layer (70) removed for clarity. The L-shaped diffractive element comprises a bracket-shaped slit (72a, 72b). The bracket-shaped slit (72a, 72b) comprises a slit having a pair of corner openings (88) at both ends of the slit. During the above MEMS fabrication, the reflective layer (70) and the second insulating layer (68) are etched to form the bracket-like slit (72a, 72b) which defines one end of the ribbon (74a). The ribbon (74a) is thus less constrained by having its normally pinned ends "clipped" by etching of the bracket-like slit (72a, 72b). Without being bound by any theory, this configuration of the improved L-structure may reduce the pinned end restoring force through means other than adjusting material properties as per the prior art device (FIG. 3A).

Figure 8B:
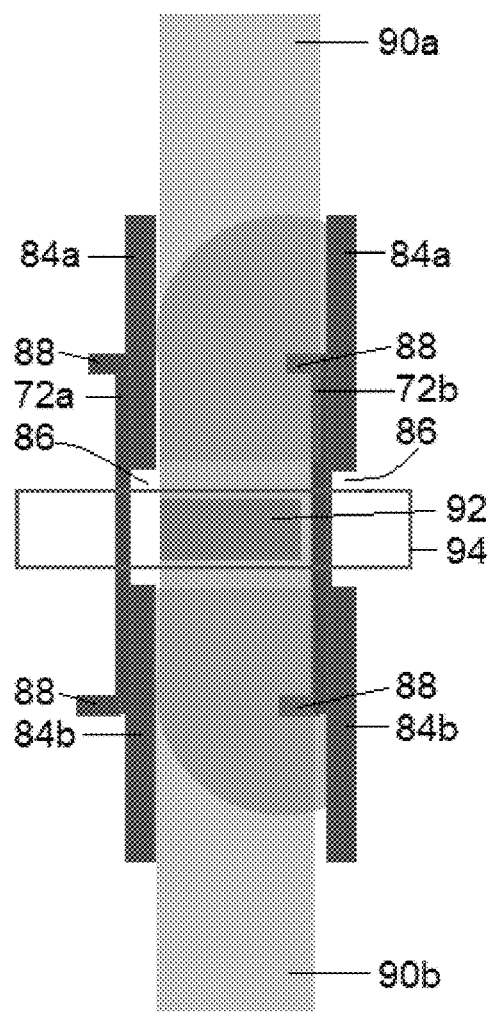
FIG. 8B is a plan view of the L-shaped diffractive element of FIG. 8A, showing the surface of the ribbon having a reflective layer comprising two electrode portions separated by a reflective portion electrically isolated therebetween.

FIG. 8B is a plan view of the L-shaped diffractive element of FIG. 8A, showing the surface of the ribbon (74a) having a reflective layer (70) comprising a pair of driving electrode portions (90a, 90b) separated by a reflective portion (92) positioned between the electrode portions (90a, 90b) and electrically isolated therebetween. An "optical spot" is designated by the superimposed rectangle (94). Within the optical spot, the reflective portion (92) of the ribbon (74a) serves as a mirror and cannot be energized by application of voltage due to being electrically isolated from the electrode portions (90a, 90b). In addition, the L-shaped diffractive element comprises the modified pedestal which has been split into the first pedestal portion (84a) and the second pedestal portion (84b) which are separated by the gap (86) exposing the central portion, such that the ribbon (74a) in the central portion is not immovably anchored flat by the pedestal (80a, 80b). When voltage is applied, the electrode portions (90a, 90b) of the ribbon (74a) are energized and bend towards the substrate (56), but force the reflective portion (92) of the ribbon (74a) to bend towards the substrate (56) concomitantly. This configuration removes electrical actuation or imposition of any electrostatic forces on the reflective portion (92) of the ribbon (74a), while allowing electrical actuation (i.e., mechanical steering) of the electrode portions (90a, 90b) of the ribbon (74a).

Figure 8C:
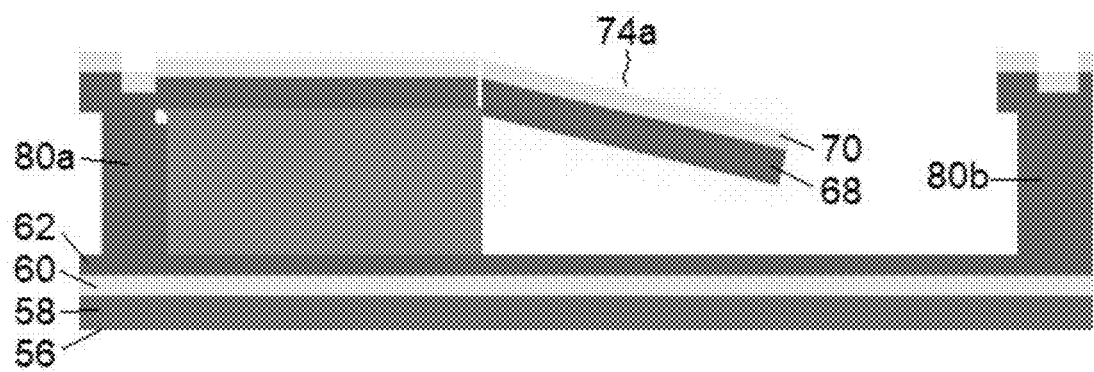
FIG. 8C is a cross-sectional view taken along line I-I of FIG. 8A, showing the L-shaped diffractive element of FIG. 8B in an energized (diffracting) state, and the portion halfway between the completely pinned end and the freed portion of the ribbon, of which the constraints can partially be decoupled through design of the slit.

FIG. 8C is a cross-sectional view taken along line I-I of FIG. 8A, showing the L-shaped diffractive element of FIG. 8B in an energized (diffracting) state. The ribbon (74a) is flat when viewed beyond the undercut, and is both partially supported and free near the edge of the undercut. With the ribbon (74a) being offset, partially detached, or weakened in this manner, the restoring force for the ribbon (74a) of the improved L-shaped diffractive element may be reduced compared to the restoring force required for a conventional ribbon (26) having its ends normally pinned to keep the ribbon taut.

Figure 9A:
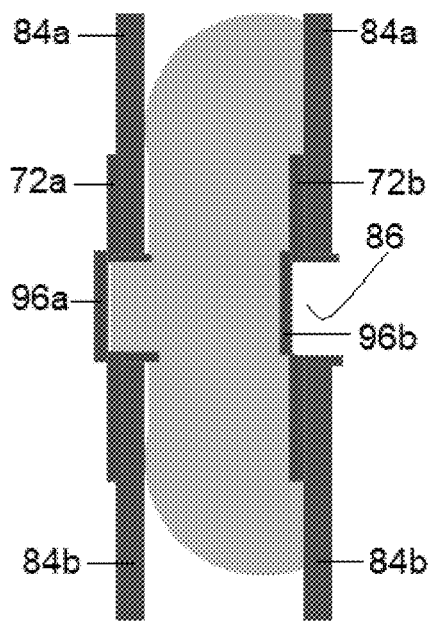
FIG. 9A shows a plan view of one embodiment of an improved L-shaped diffractive element including modified C-shaped slits to move the ribbon to the left of the pedestals.
Figure 9D:
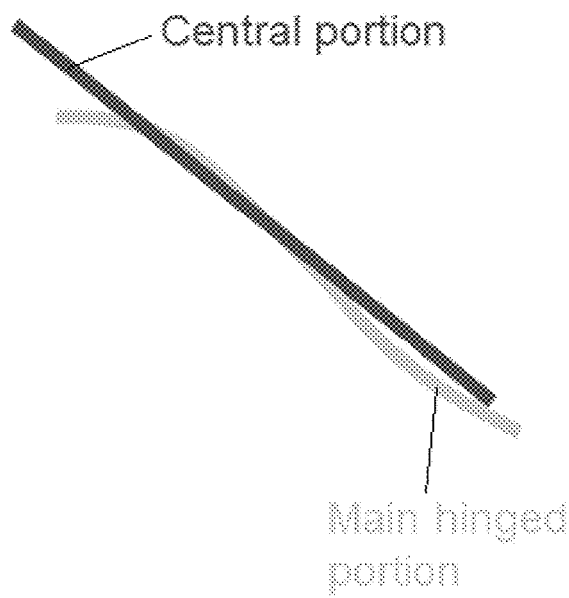
FIG. 9D is a schematic diagram showing that the configuration of the central portion of the ribbon of FIG. 9C renders F(x) as a closer approximation to a straight line to achieve a higher contrast ratio compared to the driving electrode portion of the ribbon, which exhibits some deformation.
Figure 9B:
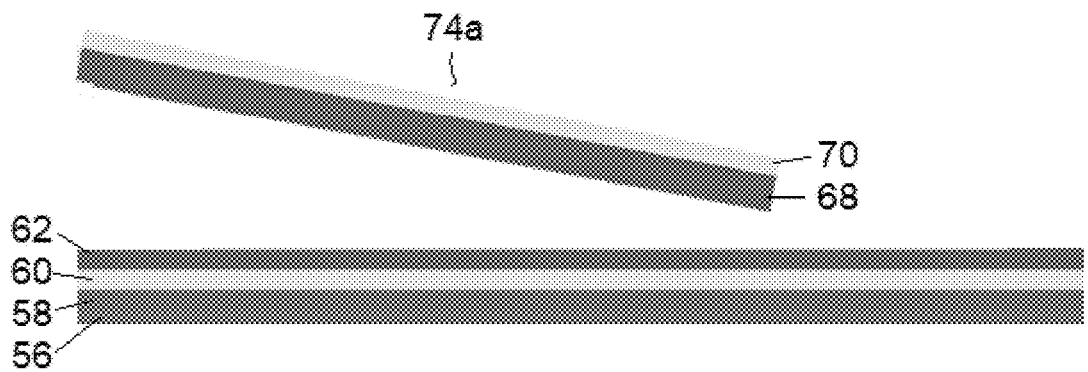
FIG. 9B is a cross-sectional view taken across the center of the L-shaped diffractive element of FIG. 9A, showing the ribbon in an energized (diffracting) state.
Figure 9C:
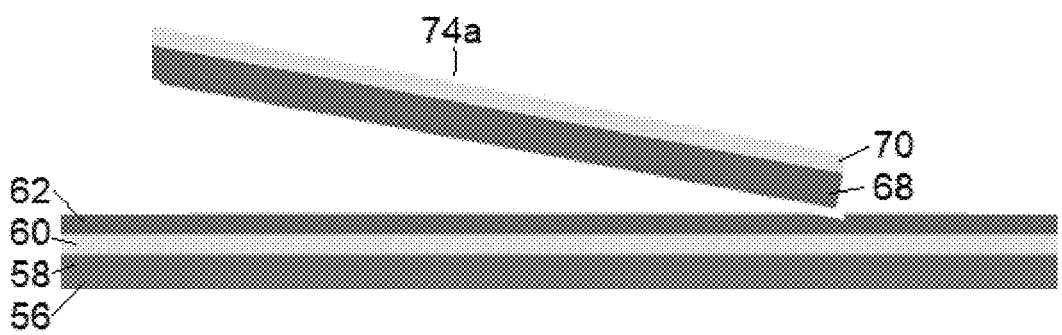
FIG. 9C is a cross-sectional view taken across the electrode portion and showing the ribbon in an energized (diffracting) state.

In one embodiment, FIG. 9A shows a plan view of an improved L-shaped diffractive element including modified C-shaped slits, with the reflecting layer (70) removed for clarity. The L-shaped diffractive element includes a slit (72a, 72b) comprising a C-shaped central bracket (96a, 96b). During the above MEMS fabrication, the reflective layer (70) and the second insulating layer (68) are etched to form the slit (72a, 72b) comprising the C-shaped central bracket (96a, 96b). The left half of the L-shaped diffractive element is formed of more material compared to the right half of the L-shaped diffractive element and is thus higher when actuated as it is less bound by the pedestal constraints. The resulting ribbon (74a) is thus moved or shifted over to be positioned offset from (in this case, left of) the pedestal portions (84a, 84b). FIG. 9B is a cross-sectional view taken across the center of the L-shaped diffractive element of FIG. 9A, showing the ribbon in an energized (diffracting) state, deflecting freely as a relatively flat mirror surface without touching down, thereby minimizing undesirable reflections or optical distortions. The shape of the slit (72a, 72b) can be modified to further decouple the actuation portion of the ribbon-induced distortion by further isolating the optical portion of the ribbon (74a) as shown. FIG. 9C is a cross-sectional view taken across the electrode portion and showing the ribbon in an energized (diffracting) state, touching down and potentially deforming. As shown schematically in FIG. 9D, the configuration of the central portion of the ribbon (74a) renders F(x) as a straight line to achieve a higher contrast ratio compared to the driving electrode portion of the ribbon (74a) which exhibits some deformation. Without being bound by any theory, this configuration of the improved L-shaped diffractive element may increase the contrast ratio by reducing pedestal induced distortions on actuation.

For clarity, the figures generally show embodiments of a single improved L-shaped diffractive element. However, it will be recognized by those skilled in the art that a plurality of improved L-shaped diffractive elements may be formed in parallel rows on a single substrate as per the MEMS fabrication described herein. Wire bonding (i.e., interconnections between multiple L-shaped diffractive elements and their packaging) is a standard technique which will not be detailed herein. It will be understood that the present invention extends to a plurality of improved L-shaped diffractive element which constitute an addressable array. The array may include L-shaped diffractive element arranged into two groups, namely moving "active" ribbons which are driven by an electronic driver channel and static "bias" ribbons which are grounded along with the common electrode, though generally all elements will be actuable as each forms the construct of a blazed grating when actuated. Individual metal connectors for providing voltage to each active ribbon provide for independent actuation.

For example, treating a first ribbon as the active ribbon and a second ribbon as the bias ribbon, the freely movable unsupported part of each ribbon is suspended above the air gap and over the electrode. When the voltage of the ribbon is set to ground potential, the active first ribbon is undeflected and co-planar with the bias second ribbon, and the device acts as a mirror so the incident light returns along the same path. When a voltage is applied between the active first ribbon and substrate, an electrical field is generated and deflects the active first ribbon relative to the bias second ribbon downward toward the substrate in response to the electrostatic force. This deflection is dictated by the optical constraints and intended mode of operation in relation to wavelength control, hence creating diffraction effects on incident light that is reflected at a phase that is different from that of the incident light. Light falling on the energized (active) pixel after reflection will propagate in different directions governed by the laws of diffraction. After removing the voltage, the active first ribbon returns to its undeflected state by nature of the high intrinsic restoring force of the second insulating or "masking" layer (i.e., silicon nitride or other material) of which it has been formed.

The invention has been described in detail with particular reference to certain preferred embodiments thereof, but it will be understood that variations and modifications can be effected within the scope of the invention. It should be apparent, however, to those skilled in the art that many more modifications besides those already described are possible without departing from the inventive concepts herein. The inventive subject matter, therefore, is not to be restricted except in the scope of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A microelectromechanical structure for modulating light comprising:
    a plurality of asymmetric deformable diffractive elements, each diffractive element having an L-shaped cross section and comprising a split pedestal and a flexible reflective member;
    the reflective member having an elongated shape of a long dimension and a short dimension, and comprising a supported part and an unsupported part, the reflective member being offset, partially detached or weakened, and comprising a pair of electrode portions separated by a reflective portion electrically isolated and mechanically coupled therebetween;
    the split pedestal extending along the long dimension of the supported part of the reflective member and being anchored to a substrate parallel to an adjacent split pedestal, the split pedestal comprising two or more portions separated by one or more gaps to yield one or more exposed areas where the reflective member is freely movable;
    the substrate supporting one or more electrodes or serving as an electrode;
    wherein the diffractive element is movable between a non-energized position wherein the diffractive element acts to reflect a beam of light as a planar mirror, to an energized position wherein upon application of an electrostatic force, the diffractive element flexes independently about an axis parallel to the long dimension of each reflective member to vary a curvature of the reflective member to deflect the beam of light.

2. The structure of claim 1, wherein the split pedestal comprises two portions separated by a gap to yield an exposed area where the reflective member is freely movable.

3. The structure of claim 2, wherein the split pedestal comprises four portions separated by gaps to yield exposed areas where the reflective member is freely movable.

4. The structure of claim 1, wherein each of the electrode portions is composed of at least one of gold, platinum, palladium, silver, nickel, titanium, tungsten, copper, chromium, or alloys thereof.

5. The structure of claim 1, wherein the reflective portion is composed of at least one of aluminum, gold, silver, copper, chromium, titanium, tungsten, and alloys thereof.

6. The structure of claim 1, wherein the reflective member is positioned offset from the split pedestal.

7. The structure of claim 1, wherein the reflective member is in electrical contact with a source of control voltage.

8. The structure of claim 1, wherein the reflective member and the split pedestal are composed of silicon nitride, silicon carbide, or a bonded silicon layer.

9. The structure of claim 1, wherein the reflective member has a reflective layer deposited thereon composed of at least one of aluminum, gold, silver, copper, chromium, titanium, tungsten, and alloys thereof.

10. The structure of claim 9, wherein the reflective layer on the supported part of the reflective member is noncontiguous with the reflective layer on the unsupported part of the reflective member, the split pedestal, or both.

11. The structure of claim 1, being partially or completely free of anomaly in the form of a divot or pit.

12. The structure of claim 1, wherein the substrate comprises a silicon substrate.

13. The structure of claim 1, wherein the one or more electrodes are composed of at least one of gold, platinum, palladium, silver, nickel, titanium, tungsten, copper, chromium, or alloys thereof.

14. The structure of claim 1, being formed by:
    providing the substrate and optionally, a dielectric layer, and fashioning one or more electrodes on the substrate or the dielectric layer;
    forming a first insulating layer over the electrode;
    forming a sacrificial layer over the first insulating layer and selectively removing the sacrificial layer to yield at least one opening defining at least one original pedestal anchored to the substrate;
    forming a second insulating layer to fill the opening and to form the reflective member;
    forming a reflective layer over the second insulating layer;
    selectively removing the reflective layer and the second insulating layer to form at least one slit extending therethrough to define at least one unsupported part of the reflective member and exposing the sacrificial layer; and
    selectively removing the sacrificial layer for a predetermined duration to release the unsupported part of the reflective member.

15. The structure of claim 14, further comprising removing an anomaly adjacent the original pedestal by depositing a planarization material within the anomaly.

16. The structure of claim 14, further comprising selectively patterning the original pedestal to form the split pedestal.

17. The structure of claim 16, further comprising modifying the split pedestal to form a bracket-shaped slit or a C-shaped central bracket.

18. The structure of claim 14, wherein a pair of adjacent reflective members is formed simultaneously.

19. A method for modulating light using a microelectromechanical structure, the micromechanical structure comprising a plurality of asymmetric deformable diffractive elements, each diffractive element having an L-shaped cross section and comprising a split pedestal and a flexible reflective member; the reflective member having an elongated shape of a long dimension and a short dimension, and comprising a supported part and an unsupported part, the reflective member being offset, partially detached or weakened, and comprising a pair of electrode portions separated by a reflective portion electrically isolated and mechanically coupled therebetween; the split pedestal extending along the long dimension of the supported part of the reflective member and being anchored to a substrate parallel to an adjacent split pedestal, the split pedestal comprising two or more portions separated by one or more gaps to yield one or more exposed areas where the reflective member is freely movable; and the substrate supporting one or more electrodes or serving as an electrode;

the method comprising directing a beam of light to the diffractive elements, wherein the diffractive elements act to reflect the beam of light as planar mirrors; and applying an electrostatic force to flex the diffractive elements independently about an axis parallel to the long dimension of each reflective member to vary a curvature of the reflective member and deflect the beam of light.

\* \* \* \* \*